United States Patent
Hou et al.

(10) Patent No.: US 9,799,683 B2
(45) Date of Patent: Oct. 24, 2017

(54) ARRAY SUBSTRATE, PREPARATION METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xuecheng Hou, Beijing (CN); Kai Lu, Beijing (CN); Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/098,914

(22) Filed: Apr. 14, 2016

(65) Prior Publication Data
US 2016/0380005 A1    Dec. 29, 2016

(30) Foreign Application Priority Data
Jun. 26, 2015  (CN) .......................... 2015 1 0363072

(51) Int. Cl.
*H01L 27/15*   (2006.01)
*H01L 27/14*   (2006.01)
*H01L 27/12*   (2006.01)

(52) U.S. Cl.
CPC ........ *H01L 27/1248* (2013.01); *H01L 27/124* (2013.01); *H01L 27/1244* (2013.01); *H01L 27/1259* (2013.01)

(58) Field of Classification Search
None
See application file for complete search history.

(56) References Cited

U.S. PATENT DOCUMENTS

2001/0052952 A1* 12/2001 Choo ............... G02F 1/133555
                                                                    349/43
2003/0124778 A1*  7/2003 Doi ..................... H01L 27/1214
                                                                    438/151
(Continued)

FOREIGN PATENT DOCUMENTS

CN    103107135 A    5/2013
CN    104716145 A    6/2015

OTHER PUBLICATIONS

First Office Action dated Jul. 3, 2017 corresponding to Chinese application No. 201510363072.7.

*Primary Examiner* — Sitaramarao S Yechuri
(74) *Attorney, Agent, or Firm* — Nath, Goldberg & Meyer; Joshua B. Goldberg

(57) ABSTRACT

The present invention provides an array substrate, a preparation method thereof and a display device. The array substrate includes at least one thin film transistor and a resin layer having at least one resin via hole, wherein a film-thickness-difference-adjusting layer used for reducing the film thickness difference at the resin via hole is arranged at the lower part of the resin layer in at least a part of the resin via hole. By providing the film-thickness-difference-adjusting layer, the film thickness difference at the resin via hole can be effectively reduced, and when a photolithographic process is performed, the difference of the thickness of the photoresist here and the thicknesses at other positions is reduced, so that the via hole fluctuation of a passivation layer caused by the larger film thickness difference at the resin via hole is improved, and the metal residue problem of the pixel electrodes is effectively avoided.

14 Claims, 2 Drawing Sheets

(56) References Cited

U.S. PATENT DOCUMENTS

| | | | |
|---|---|---|---|
| 2003/0193624 A1* | 10/2003 | Kobayashi | G02F 1/136227 349/42 |
| 2011/0031492 A1* | 2/2011 | Yamazaki | H01L 27/1225 257/43 |
| 2013/0023115 A1* | 1/2013 | Fan | H01L 27/0207 438/586 |
| 2013/0092923 A1* | 4/2013 | Hara | H01L 27/1214 257/43 |
| 2014/0085577 A1* | 3/2014 | Zhou | G02F 1/134363 349/106 |
| 2015/0008429 A1* | 1/2015 | Ito | H01L 23/53238 257/43 |
| 2016/0079278 A1 | 3/2016 | Wei et al. | |

* cited by examiner

ARRAY SUBSTRATE, PREPARATION METHOD THEREOF AND DISPLAY DEVICE

FIELD OF THE INVENTION

The present invention belongs to the field of display technology, and in particular, relates to an array substrate, a preparation method thereof and a display device.

BACKGROUND OF THE INVENTION

A resin material is low in dielectric constant, good in flatness and high in transmittance, so it can be used as the material of insulating layers in an array substrate to reduce the capacitance among structures. However, the thickness of a resin layer is large, so the film thickness difference at a resin via hole is large as well, as a result, in the subsequent photolithographic process of the layers, photoresist at the resin via hole is thicker than that at other positions and thus is difficult to be removed completely, and film residue is liable to generate after etching to influence the product structure and cause poor display.

For example, FIG. 1 shows a diagrammatic drawing of an existing array substrate after pixel electrodes are formed. The pixel electrodes 19 in FIG. 1 are pixel electrodes of two adjacent sub-pixels, the pixel electrode 19 of an independent sub-pixel is located at the left side of a via hole 18, and the pixel electrode of another independent sub-pixel is located at the right side of the via hole 18, wherein a drain electrode 15 of a thin film transistor (sometimes called as "TFT" hereinafter) is located at the lower part of a resin layer 16, a passivation layer 17 is formed on the resin layer 16, and the via hole 18 (located in the resin via hole) needs to be formed in the passivation layer 17 by the photolithographic process, so as to connect the pixel electrode 19 on the passivation layer 17 with the drain electrode 15.

The first step of the above photolithographic process is to coat the photoresist, and as shown in FIG. 2, the thickness of the photoresist 10 at the resin via hole (2.2-4.2μm) is larger than the thickness of the photoresist 10 at other positions (1.3-1.5μm). When the photoresist is exposed through a mask plate 3, as shown in a figure on the left side in FIG. 3, the photoresist 10 in the resin via hole of a pixel region 1 is liable not to be completely removed due to insufficient exposure, while as shown in a figure on the right side in FIG. 3, the photoresist 10 in a non-pixel region 2 is fully exposed under the process condition and forms a corresponding shape; as shown in FIG. 4, in the subsequent etching process, the passivation layer 17 below the residual photoresist at the resin via hole is shielded, and thus cannot be completely etched, or cannot be etched at all, resulting in that the via hole of the passivation layer 17 is too small or absent. When the via hole of the passivation layer 17 is absent, the pixel electrode located on the passivation layer 17 cannot be connected with the drain electrode, so the pixel cannot emit light, resulting in poor display.

Similarly, as shown in FIG. 5, when the pixel electrodes 19 are formed, if the photoresist 102 in the resin via hole cannot be completely removed, the material of a part of pixel electrodes cannot be removed, such that the pixel electrodes 19 in the adjacent sub-pixels are connected, and independent pixel electrodes 19 (as shown in FIG. 6) cannot be obtained.

It is well known that the array substrate may further include a thin film transistor (not shown in the figure), a substrate, a gate insulation layer, a gate electrode and other structures.

SUMMARY OF THE INVENTION

Technical Problem to be Solved in the Present Invention

As mentioned above, in a process of preparing an array substrate by a photolithographic process, since a resin layer is thicker, the film thickness difference at a via hole of the resin layer is larger. Therefore, the thickness of subsequently coated photoresist is larger. And then, the photoresist is unlikely to be fully removed by subsequent exposure, resulting in such problems that the via hole of a passivation layer is too small or absent, or independent pixel electrodes cannot be obtained.

Generally, the thickness of the resin layer is 1.2-3.0 μm, and since a signal line metal layer is present at the resin via hole, the actual film thickness difference at the via hole is 0.9-2.7 μm.

The present invention is accomplished in view of the above, with an object of providing an array substrate and a preparation method thereof by changing the structural design of the array substrate so as to solve the above problem.

Solution of the Problem

According to an embodiment of the present invention, an array substrate is provided, including at least one thin film transistor and a resin layer having at least one resin via hole, the thin film transistor including a source electrode, a drain electrode, a gate electrode and an active layer, wherein an film-thickness-difference-adjusting layer used for reducing the film thickness difference at the resin via hole is arranged at the lower part of the resin layer located in at least a part of the resin via hole.

Preferably, the array substrate includes a pixel region and a non-pixel region, the resin layer having the resin via hole is arranged in the pixel region, and the film-thickness-difference-adjusting layer is arranged at the lower part of the resin layer at the resin via hole in the pixel region.

Preferably, the drain electrode is arranged in the resin layer in the pixel region, the resin via hole is formed in the resin layer above the drain electrode, the film-thickness-difference-adjusting layer is located below the drain electrode, and the projection of the film-thickness-difference-adjusting layer on the substrate and the projection of the drain electrode on the substrate at least partially overlap.

Preferably, the pixel region further includes a gate insulation layer, and the film-thickness-difference-adjusting layer is arranged between the gate insulation layer and the drain electrode.

Preferably, the projections of the film-thickness-difference-adjusting layer and the drain electrode on the substrate completely overlap.

Preferably, the resin layer is composed of photosensitive resin or non-photosensitive resin.

Preferably, the thickness of the resin layer is 1.2-3.0 μm.

Preferably, the film-thickness-difference-adjusting layer is the active layer.

Preferably, the film-thickness-difference-adjusting layer is a gate layer.

Preferably, the thickness of the film-thickness-difference-adjusting layer is 0.2-0.35 μm.

The present invention further provides a preparation method of an array substrate, the array substrate including at least one thin film transistor and a resin layer having at least one resin via hole, the thin film transistor including a source electrode, a drain electrode, a gate electrode and an active layer, the preparation method of the array substrate including:

a step of forming a film-thickness-difference-adjusting layer at the lower part of the resin layer located in at least a part of the resin via hole, wherein the film-thickness-difference-adjusting layer is used for reducing the film thickness difference at the resin via hole.

Preferably, the step of forming the film-thickness-difference-adjusting layer is a step of forming the active layer.

Preferably, the step of forming the film-thickness-difference-adjusting layer is a step of forming the gate electrode.

The present invention further provides a display device including the above array substrate.

The array substrate of the present invention is particularly suitable for a variety of display devices, and is particularly suitable for high-resolution display devices.

Effect of the Invention

According to the array substrate of the present invention, by providing the film-thickness-difference-adjusting layer below the resin via hole, the film thickness difference at the resin via hole is effectively reduced, therefore, when a photolithographic process is carried out on the layers subsequently, the difference between the thickness of the photoresist at the resin via hole and the thicknesses of the photoresist at other positions is reduced, which is conducive to improving such problems as via hole fluctuation of the passivation layer caused by the larger film thickness difference at the resin via hole, and when the present invention is used in a pixel electrode photolithographic process, the metal residue problem of the pixel electrodes can also be effectively avoided, so independent pixel electrodes can be effectively formed. The array substrate of the present invention is suitable for a variety of display devices, and is particularly suitable for high-resolution display devices.

wherein reference signs are as follows: 1. pixel region; 2. non-pixel region; 3. mask plate; 10. photoresist; 102. photoresist; 11. substrate; 13. gate insulation layer; 14. film-thickness-difference-adjusting layer; 15. drain electrode; 16. resin layer; 17. passivation layer; 18. via hole; 19. pixel electrode; 22. gate electrode.

DESCRIPTION OF THE PREFERRED EMBODIMENT

In order that those skilled in the art better understand the technical solutions of the present invention, a further detailed description of the present invention will be given below in conjunction with the accompanying drawings and specific embodiments.

First Embodiment

The embodiment provides an array substrate, including at least one thin film transistor and a resin layer having at least one resin via hole, the thin film transistor including a source electrode, a drain electrode, a gate electrode and an active layer, wherein an film-thickness-difference-adjusting layer used for reducing the film thickness difference at the resin via hole is arranged at the lower part of the resin layer located in at least a part of the resin via hole.

According to the array substrate of the embodiment, as mentioned above, the film-thickness-difference-adjusting layer is arranged below the resin via hole to effectively reduce the film thickness difference at the resin via hole, therefore when a subsequent photolithographic process is carried out, the difference of the thickness of the photoresist at the resin via hole and the thicknesses at other positions can be reduced, which is conducive to improving via hole fluctuation of a passivation layer and the like caused by the larger film thickness difference at the resin via hole, and the metal residue problem of pixel electrodes can also be effectively avoided.

It should be noted that, in the present invention, the term "film thickness difference" refers to the thickness difference of film structures on the substrate. The term "via hole fluctuation" mean that the removal degrees of the photoresist in the via holes on the substrate are different due to the uniformity fluctuation of photoresist coating and exposure, such that the via holes to be formed subsequently are too small to some extant or even absent.

Second Embodiment

Figure 7:
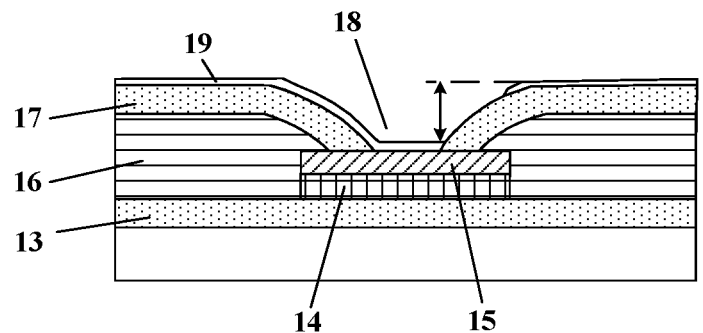
FIG. 7 is a structure diagram of an array substrate in a second embodiment of the present invention after pixel electrodes are formed.

The embodiment provides an array substrate, as shown in FIG. 7, including at least one thin film transistor and a resin layer 16 having at least one resin via hole (via hole 18), the thin film transistor including a source electrode, a drain electrode 15, a gate electrode (not shown in the figure), a gate insulation layer 13 and an active layer, a film-thickness-difference-adjusting layer 14 is arranged at the resin via hole 18, wherein the film-thickness-difference-adjusting layer 14 is located at the lower part of the resin layer 16 and is used for reducing the film thickness difference at the resin via hole.

Figure 1:
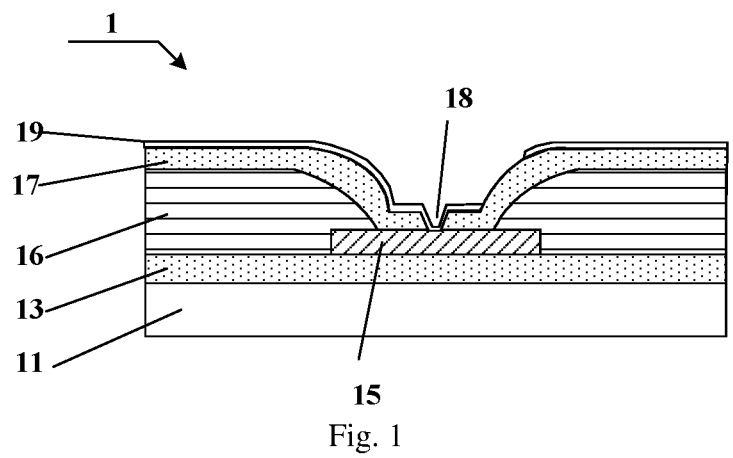
FIG. 1 is a structure diagram of an existing array substrate after pixel electrodes are formed.
Figure 2:
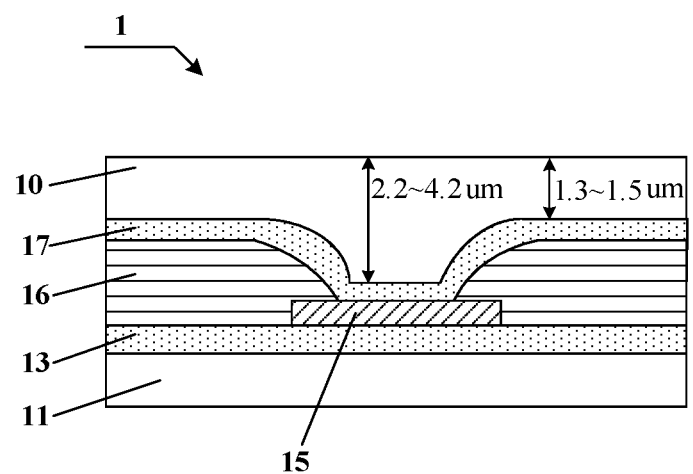
FIG. 2 is a structure diagram of the existing array substrate after coating photoresist, when forming a passivation layer via hole.
Figure 3:
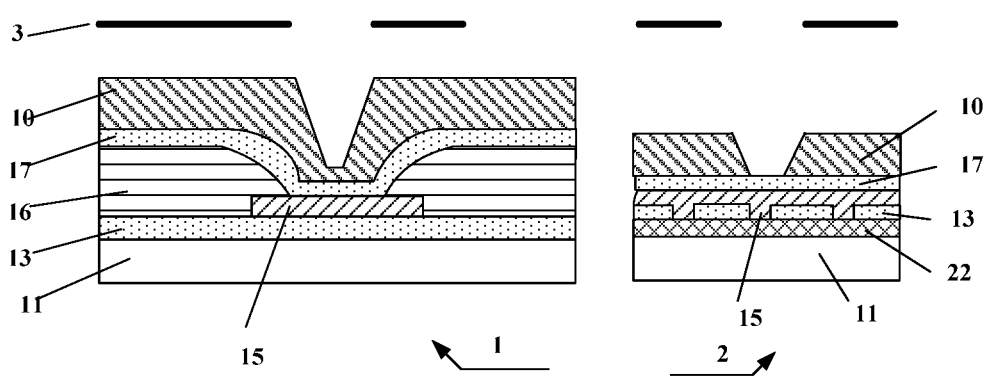
FIG. 3 is a structure diagram of the existing array substrate after a passivation layer is photoetched, wherein a left figure is a pixel region, and a right figure is a non-pixel region.
Figure 4:
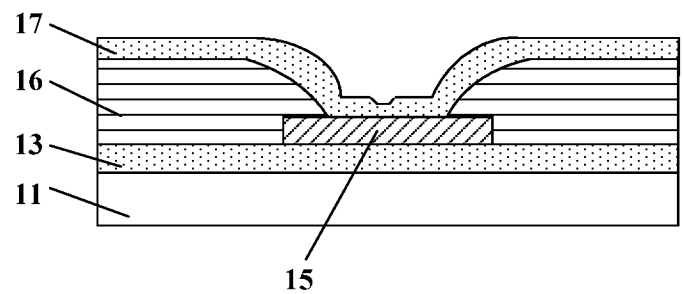
FIG. 4 is a structure diagram of the existing array substrate after the passivation layer via hole is formed.
Figure 5:
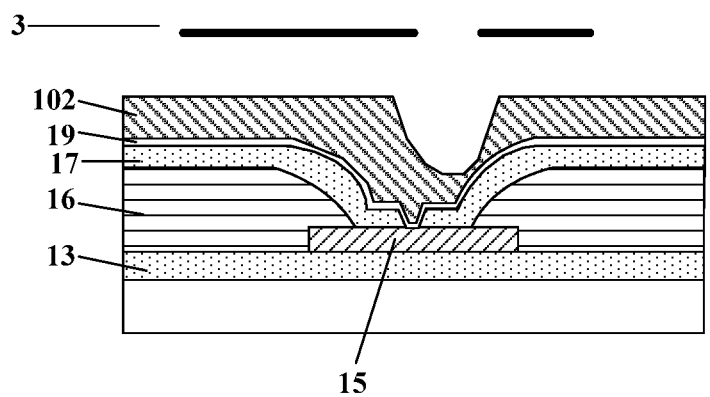
FIG. 5 is a structure diagram of the existing array substrate after the pixel electrodes are photoetched.
Figure 6:
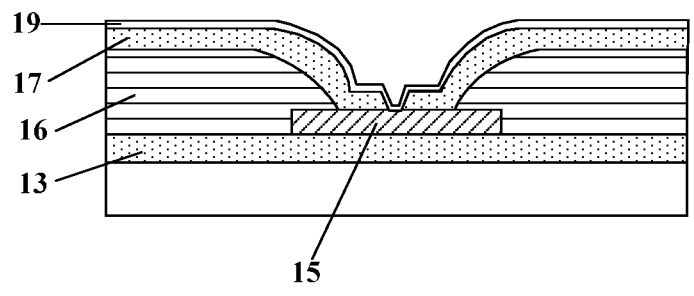
FIG. 6 is a structure diagram of the existing array substrate after the pixel electrodes are formed.

The film-thickness-difference-adjusting layer 14 is arranged below the resin via hole to raise the drain electrode at the resin via hole, so as to reduce the film thickness difference at the resin via hole. Therefore, when a photolithographic process is carried out on the layers subsequently, the difference of the thickness of the photoresist 10 at the resin via hole and the thicknesses of the photoresist 10 at other positions is reduced, in this way, when the photoresist is coated, the thickness of the coated photoresist may be reduced, so the situation that the photoresist 10 in the resin via hole cannot be completely removed due to insufficient exposure is avoided, and meanwhile, the photoresist 10 of a non-pixel region 2 will not be etched deeply; in addition, the condition as shown in FIG. 5, i.e., the photoresist 102 in the resin via hole cannot be completely removed and thereby the material for forming pixel electrodes 19 cannot be removed, resulting in that the pixel electrodes 19 in adjacent sub-pixels are connected, namely independent pixel electrodes cannot be obtained, will not occur.

Therefore, the array substrate of the embodiment is conducive to improving the via hole fluctuation of a passivation layer 17 caused by the larger film thickness difference at the resin via hole, and meanwhile the problem that the pixel electrodes 19 are connected due to metal residue is avoided.

Preferably, the array substrate includes a pixel region and a non-pixel region, the resin layer 16 having the resin via hole is arranged in the pixel region, and the film-thickness-difference-adjusting layer 14 is arranged at the lower part of the resin layer 16 at the resin via hole in the pixel region. It should be noted that, in FIG. 7, only the pixel region is shown and the non-pixel region is omitted.

Generally, the resin layer 16 having a thickness of 1.2-3.0 µm is arranged in the pixel region. The thickness is larger, so the film thickness difference at the resin via hole is larger as well. The film-thickness-difference-adjusting layer 14 is arranged at the lower part of the resin layer 16 at the resin via hole in the pixel region to reduce the film thickness difference. In this case, the pixel region generally refers to a region used for displaying at the middle part of a display panel, and the non-pixel region refers to a region which surrounds the pixel region and is used as a frame or used for arranging leads and the like.

The drain electrode 15 is arranged in the resin layer 16 in the pixel region, the resin via hole is formed in the resin layer 16 above the drain electrode 15, the film-thickness-difference-adjusting layer 14 is located below the drain electrode 15, and the projection of the film-thickness-difference-adjusting layer 14 on the substrate and the projection of the drain electrode 15 on the substrate at least partially overlap. Namely, in this manner, the drain electrode 15 can be actually arranged on the film-thickness-difference-adjusting layer 14 to achieve an effect of raising the drain electrode 15 and reducing the film thickness difference.

As shown in FIG. 7, the pixel region may further include a gate insulation layer 13, and the film-thickness-difference-adjusting layer 14 is arranged between the gate insulation layer 13 and the drain electrode 15.

Generally, the drain electrode 15 is arranged below the resin via hole in the pixel region, the film thickness difference of the via hole here is generally 0.9-2.7 µm. The film-thickness-difference-adjusting layer 14 is arranged below the drain electrode 15 to effectively reduce the film thickness difference, for example, the thickness of the film-thickness-difference-adjusting layer 14 may be 0.2-0.35 µm, and in this case, the film thickness difference at the resin via hole may be reduced from 0.9-2.7 µm to 0.55-2.5 µm. When the film thickness difference is reduced, the thickness of the subsequently coated photoresist at the via hole is reduced, thus facilitating fully removing the photoresist by subsequent exposure to ensure the via hole of the passivation layer, so as to reduce or avoid the fluctuation of the via hole. Similarly, when forming the pixel electrodes 19, since the film thickness difference is reduced, the photoresist in the resin via hole is liable to be removed completely, in this way, in subsequent steps, the phenomenon that a part of materials of the pixel electrodes cannot be removed will not occur, so it can ensure that independent pixel electrodes are obtained.

In addition, the projections of the film-thickness-difference-adjusting layer 14 and the drain electrode 15 on the substrate may completely overlap. In this manner, the drain electrode 15 can be more assuredly arranged on the film-thickness-difference-adjusting layer 14 to assuredly achieve the effect of raising the drain electrode 15 and reducing the film thickness difference. In other words, the film-thickness-difference-adjusting layer 14 just entirely raises the region covered by the drain electrode 15, so that the film thickness difference at the entire resin via hole can be reduced, and thus the embodiment is more preferred.

The resin layer 16 is composed of photosensitive resin or non-photosensitive resin. That is, the technical solution in which the film-thickness-difference-adjusting layer 14 is arranged below the resin via hole is suitable for all array substrates containing resin layers 16, and the material of the resin layers of the array substrates can be either photosensitive resin or non-photosensitive resin.

Preferably, the thickness of the resin layer 16 is 1.2-3.0 µm. When the thickness of the resin layer 16 is 1.2-3.0 µm, by arranging the film-thickness-difference-adjusting layer 14 below the resin via hole, the film thickness difference at the resin via hole can be effectively reduced.

As one embodiment, the film-thickness-difference-adjusting layer 14 can be the same layer as the active layer. In this case, when fabricating the active layer of the TFT, a relatively independent active layer is reserved at the resin via hole to serve as the film-thickness-difference-adjusting layer, so as to reduce the film thickness difference of the resin via hole. The pattern of the mask plate of the active layer may be changed, so that the relatively independent active layer is reserved at the resin via hole. For example, the thickness of the active layer may be 0.2-0.35 µm, and in this case, the film thickness difference at the resin via hole may be reduced from 0.9-2.7 µm to 0.55-2.5 µm, to effectively relieve the poor display caused by the film thickness difference of the resin via hole.

It should be noted that, in the present invention, the expression "poor display caused by the film thickness difference of the resin via hole" means that, for example, the pixel electrodes cannot be connected with the drain electrode due to the larger film thickness difference of the resin via hole, such that the pixel cannot emit light, or independent pixel electrodes cannot be formed due to the larger film thickness difference of the resin via hole, and the like.

As another embodiment, the film-thickness-difference-adjusting layer 14 can be gate layer.

In this case, the mask plate of the gate electrode may be changed, so that a gate metal structure is reserved at the resin via hole to reduce the film thickness difference of the resin via hole.

The thickness of the film-thickness-difference-adjusting layer 14 is preferably 0.2-0.35 µm. If the film-thickness-difference-adjusting layer 14 is too thin, it cannot fully function to reduce the film thickness difference and cannot well solve such problems as poor display caused by the larger film thickness difference and the like; and on the other hand, if the film-thickness-difference-adjusting layer 14 is too thick, it is unfavorable for preparation by the existing process.

Obviously, the specific details of the above embodiments may have a variety of modifications; for example, the specific thickness of the resin layer on the array substrate can be changed according to the specific products, or, with regard to the film thickness differences at the via holes of other positions on the array substrate, the film thickness differences at corresponding positions can be reduced by arranging the film-thickness-difference-adjusting layer in a similar manner as the present invention, and the various modifications and improvements as above shall be encompassed within the protection scope of the present invention.

Third Embodiment

The embodiment provides a preparation method of an array substrate, the array substrate including at least one thin film transistor and a resin layer having at least one resin via hole, the thin film transistor including a source electrode, a drain electrode, a gate electrode and an active layer, the preparation method of the array substrate including: a step of forming an film-thickness-difference-adjusting layer at the lower part of the resin layer located in at least a part of the resin via hole, wherein the film-thickness-difference-adjusting layer is used for reducing the film thickness difference at the resin via hole.

It should be noted that, in a preparation process of the array substrate, formation of a gate metal layer, an active layer, a gate insulation layer via hole, a signal line layer, an organic resin layer, a common electrode layer, a passivation layer via hole, a pixel electrode layer and the like is known.

The process of the array substrate in the embodiment will be illustrated below with reference to FIG. 7. The process of forming the array substrate can include, for example, a step of forming a gate insulation layer 13 on the substrate, a step of forming the film-thickness-difference-adjusting layer, a step of forming the source electrode (not shown in the figure) and the drain electrode, a step of forming the resin layer 16 having at least one resin via hole 18, a step of forming a passivation layer 17, a step of forming the passivation layer via hole by a passivation layer photolithographic procedure, and a step of forming pixel electrodes 19 by depositing pixel electrodes ITO or other transparent metal and then by a pixel electrode photolithographic process.

The embodiment is characterized by including a step of forming the film-thickness-difference-adjusting layer used for reducing the film thickness difference at the resin via hole 18. As mentioned above, the thickness of the resin layer 16 is generally 1.2-3.0 µm. The thickness is larger, so the film thickness difference at the resin via hole is large as well, and the actual film thickness difference at the via hole is 0.9-2.7 µm, which is very likely to cause poor display of the device. Therefore, according to the embodiment, by providing the step of forming the film-thickness-difference-adjusting layer, the film thickness difference at the resin via hole can be effectively reduced. When the film thickness difference at the resin via hole is reduced, the difference of the thickness of the photoresist at the resin via hole and the thicknesses of the photoresist at other positions can be reduced, so as to effectively improve via hole fluctuation of a passivation layer and the like; and furthermore, the photoresist in the resin via hole can also be effectively removed to inhibit the generation of residual photoresist, so as to effectively inhibit the situation that the via hole of the passivation layer is too small or even absent, or independent pixel electrodes cannot be obtained.

Preferably, the step of forming the film-thickness-difference-adjusting layer is the step of forming the active layer. In this case, the film-thickness-difference-adjusting layer 14 is the relatively independent active layer. The thickness of the active layer can be set to 0.2-0.35 µm, and in this case, the film thickness difference at the resin via hole can be reduced from 0.9-2.7 µm to 0.55-2.5 µm.

In addition, the step of forming the film-thickness-difference-adjusting layer can further include a step of forming the gate electrode.

The present embodiment is suitable for the process of a array substrate including a resin layer, wherein the active layer with the source electrode and the drain electrode are not fabricated in a same step.

Fourth Embodiment

The embodiment provides a display device, including any array substrate described above. The display device can be any product or component having a display function, such as an OLED panel, a liquid crystal display panel, an electronic paper, a mobile phone, a tablet computer, a television, a display, a notebook computer, a digital photo frame, a navigator or the like.

It can be understood that, the above embodiments are merely exemplary embodiments used for illustrating the principle of the present invention, but the present invention is not limited thereto. Those of ordinary skill in the art can make a variety of modifications and improvements without departing from the spirit and essence of the present invention, and these modifications and improvements shall also be encompassed within the protection scope of the present invention.

The invention claimed is:

1. An array substrate, comprising at least one thin film transistor and a resin layer having at least one resin via hole, the thin film transistor comprising a source electrode, a drain electrode, a gate electrode and an active layer, and a passivation layer different than the resin layer, the passivation layer comprising a portion within the at least one resin via hole, which defines a tapered passivation via hole, wherein a film-thickness-difference-adjusting layer used for reducing the film thickness difference at the resin via hole is arranged at the lower part of the resin layer only corresponding to the resign via hole,
wherein the resign layer is arranged around the drain electrode and the film-thickness-difference-adjusting layer, the resign via hole is formed in the resign layer above the drain electrode, and the film-thickness-difference-adjusting layer is located below the drain electrode.

2. The array substrate of claim 1, wherein the array substrate comprises a pixel region and a non-pixel region, the resin layer having the resin via hole is arranged in the pixel region, and the film-thickness-difference-adjusting layer is arranged at the lower part of the resin layer at the resin via hole in the pixel region.

3. The array substrate of claim 2, wherein the drain electrode is arranged in the resin layer in the pixel region, the resin via hole is formed in the resin layer above the drain electrode and the projection of the film-thickness-difference-adjusting layer on the substrate and the projection of the drain electrode on the substrate at least partially overlap.

4. The array substrate of claim 3, wherein the pixel region further comprises a gate insulation layer, and the film-thickness-difference-adjusting layer is arranged between the gate insulation layer and the drain electrode.

5. The array substrate of claim 3, wherein the projections of the film-thickness-difference-adjusting layer and the drain electrode on the substrate completely overlap.

6. The array substrate of claim 1, wherein the resin layer is composed of photosensitive resin or non-photosensitive resin.

7. The array substrate of claim 1, wherein the thickness of the resin layer is 1.2-3.0 µm.

8. The array substrate of claim 1, wherein the film-thickness-difference-adjusting layer is the active layer.

9. The array substrate of claim 1, wherein the film-thickness-difference-adjusting layer is the same layer as the gate electrode layer and is independent relative to the gate electrode layer.

10. The array substrate of claim 1, wherein the thickness of the film-thickness-difference-adjusting layer is 0.2-0.35 µm.

11. A display device, comprising the array substrate of claim 1.

12. A preparation method of an array substrate comprising at least one thin film transistor and a resin layer having at least one resin via hole, the thin film transistor comprising a source electrode, a drain electrode, a gate electrode and an active layer, and a passivation layer different than the resin layer, the passivation layer comprising a portion within the at least one resin via hole, which defines a tapered passivation via hole, the preparation method of the array substrate comprising:

a step of forming a film-thickness-difference-adjusting layer, which is used for reducing the film thickness difference at the resin via hole, at the lower part of the resin layer only corresponding to the resin via hole, wherein the resin layer is arranged around the drain electrode and the film-thickness-difference-adjusting layer, the resign via hole is formed in the resign layer above the drain electrode, and the film-thickness-difference-adjusting layer is located below the drain electrode.

13. The preparation method of the array substrate according to claim 12, wherein the step of forming the film-thickness-difference-adjusting layer is a step of forming the active layer.

14. The preparation method of the array substrate according to claim 12, wherein the step of forming the film-thickness-difference-adjusting layer is a step of forming the gate electrode.

\* \* \* \* \*